(12) United States Patent
Jeon

(10) Patent No.: US 7,432,125 B2
(45) Date of Patent: Oct. 7, 2008

(54) CMOS IMAGE SENSOR AND MANUFACTURING METHOD THEREOF

(75) Inventor: In-Gyun Jeon, Icheon (KR)

(73) Assignee: Dongbu Electronics Co., Ltd., Seoul (KR)

( * ) Notice: Subject to any disclaimer, the term of this patent is extended or adjusted under 35 U.S.C. 154(b) by 219 days.

(21) Appl. No.: 10/954,494

(22) Filed: Oct. 1, 2004

(65) Prior Publication Data

US 2005/0072994 A1  Apr. 7, 2005

(30) Foreign Application Priority Data

Oct. 1, 2003  (KR) .............. 10-2003-0068497

(51) Int. Cl.
*H01L 21/00* (2006.01)
(52) U.S. Cl. .............. 438/83; 438/57; 438/73; 438/97; 257/E21.585; 257/E25.032
(58) Field of Classification Search .......... 438/57, 438/73, 97, 83; 257/E21.585, E25.032
See application file for complete search history.

(56) References Cited

U.S. PATENT DOCUMENTS 4,977,096 A * 12/1990 Shimada et al. .......... 438/59

5,675,158 A   10/1997 Lee
6,297,984 B1 * 10/2001 Roizin ................ 365/106
6,552,320 B1   4/2003 Pan
2001/0052574 A1 * 12/2001 Kurosawa et al. ...... 250/423 P
2002/0074481 A1 *  6/2002 McGrath et al. ...... 250/208.1

FOREIGN PATENT DOCUMENTS

KR  10-2003-0073997 A   9/2003

OTHER PUBLICATIONS

S. Wolf and R.N. Tauber, Silicon Processing for the VLSI Era vol. 1—Process Technology, Copyright 2000, Lattice Press, pp. 488-490, 655.*

* cited by examiner

*Primary Examiner*—Matthew S. Smith
*Assistant Examiner*—Jarrett J Stark
(74) *Attorney, Agent, or Firm*—Finnegan, Henderson, Farabow, Garrett & Dunner, L.L.P.

(57) ABSTRACT

A CMOS image sensor-manufacturing method includes forming a photodiode on a substrate, forming an insulating layer over the substrate, forming a contact hole in the insulating layer, and forming a gate terminal over the insulating layer. The gate terminal is connected to the photodiode through the contact hole.

4 Claims, 3 Drawing Sheets

CMOS IMAGE SENSOR AND MANUFACTURING METHOD THEREOF

RELATED APPLICATION

This application is related to and claims priority under 35 U.S.C. § 119 to Korean Patent Application No. 10-2003-0068497, filed on Oct. 1, 2003, the entire contents of which are expressly incorporated herein by reference.

BACKGROUND (a) Technical Field

The present invention relates to a CMOS image sensor and a manufacturing method thereof.

(b) Description of Related Art

A semiconductor image sensor is a semiconductor device converting optical images into electrical signals and typically manufactured in a type of a charge coupled device (CCD) or a complementary metal oxide semiconductor (CMOS) image sensor.

A charge coupled device is an integrated circuit containing an array coupled capacitors. Each capacitor stores and transfers electric charges to one or more of the neighboring capacitors thereof.

In contrast, a CMOS image sensor includes MOS transistors, photo-sensing regions for detecting an external light and generating and accumulating photocharges upon receiving external light, and a logic circuit area for processing to convert the light into electric signals. A CMOS image sensor also includes color filters arranged over the photo-sensing region.

The photo-sensing region may have formed therein a photodiode. An incident light generates electron-hole pairs (EHP) in the photodiode, wherein the holes are absorbed into the semiconductor substrate and the electrons are accumulated at the photodiode. In order to improve characteristics of the CMOS image sensor, it is important to hold the electrons without loss and transfer potential variation of the photodiode to a gate electrode of an adjacent MOS transistor without loss.

A conventional CMOS image sensor may be described with reference to FIGS. 7 and 8, wherein FIG. 7 is a plan view of a conventional CMOS image sensor 100, and FIG. 8 is a cross-sectional view of CMOS image sensor 100 along line I-I' of FIG. 7. As shown in FIGS. 7 and 8, CMOS image sensor 100 is formed on a semiconductor substrate 102 and includes an active device 104 and a photodiode 106. A device isolation region 108 isolates device 104 from other devices (not shown) of CMOS image sensor 100. A gate terminal 110 is provided over active device 104. An insulating layer 112 is provided over gate terminal 110 and photodiode 106 and two contact holes 114 and 116 are respectively formed in insulating layer 112 over gate terminal 110 and photodiode 106. Metal plugs 118 and 120 are filled in contact holes 114 and 116, respectively. A connecting member 122 is deposited over the structure and is connected to both metal plugs 118 and 120. Metal plugs 118 and 120 may comprise tungsten and connecting member 122 may comprise aluminum. Thus, photodiode 106 is connected to gate terminal 110 through metal plug 120, connecting member 122, and metal plug 118, and the connection between photodiode 106 and gate terminal 110 includes four joints.

Conventional CMOS image sensors such as CMOS image sensor 100 have a drawback in that photodiode 106 may be damaged when contact hole 116 is formed by a dry etching technique. Furthermore, because photodiode 106 and gate terminal 110 are connected through four contact joints, the potential of photodiode 106 is transferred to the gate terminal 110 with loss, thus degrading the characteristics of CMOS image sensor 100.

SUMMARY

The present invention has been made in an effort to solve the above problems, and to provide a CMOS image sensor which is capable of efficiently transferring the potential variation of the photodiode to an adjacent gate terminal.

Consistent with the present invention, there is provided a method for manufacturing a CMOS image sensor that includes forming a photodiode on a substrate, forming an insulating layer over the substrate, forming a contact hole in the insulating layer, and forming a gate terminal of the insulating layer. The gate terminal is connected with the photodiode through the contact hole.

Consistent with the present invention, there is also provided a CMOS image sensor that includes a substrate including a photodiode, an insulating layer formed over the substrate and having a contact hole therein above the photodiode, and a gate terminal formed over the insulating layer and connected with the photodiode through the contact hole.

BRIEF DESCRIPTION OF THE DRAWINGS

The accompanying drawings, which are incorporated in and constitute a part of this specification, illustrate embodiments of the invention and, together with the description, serve to explain the objects, advantages, and principles of the invention. In the drawings.

DETAILED DESCRIPTION

Figure 1:
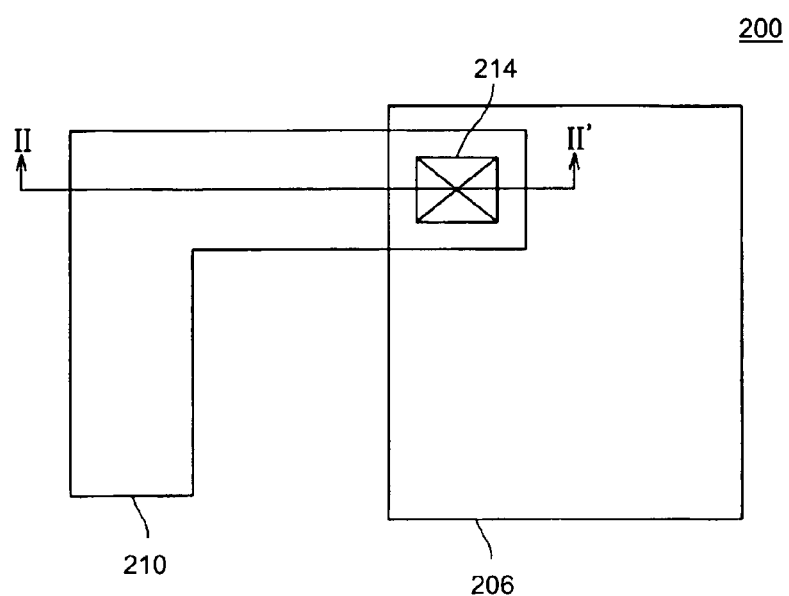
FIG. 1 is a plan view of a CMOS image sensor consistent with a first embodiment of the present invention.

Reference will now be made in detail to the present embodiments of the invention, examples of which are illustrated in the accompanying drawings. Wherever possible, the same reference numbers will be used throughout the drawings to refer to the same or like parts. In the drawings, the thickness of layers, films and regions are exaggerated for clarity.

A CMOS image sensor and a manufacturing method thereof consistent with an embodiment of the present invention will be described with reference to FIGS. 1-6 in detail.

A CMOS image sensor generally includes a pixel array structure comprised of a plurality of unit pixels. Each unit pixel may comprise a plurality of transistors and a photodiode. In one aspect, each unit pixel includes three transistors and one photodiode.

In one aspect, the photodiode of the CMOS image sensor comprises polysilicon and is connected to a gate terminal of an adjacent MOS transistor of the CMOS image sensor. Consistent with an embodiment of the present invention, the photo diode is directly connected with the gate terminal of the adjacent MOS transistor such that a potential variation of the photodiode is transferred to the gate terminal of the adjacent MOS transistor and the gate potential in turn drives the adjacent MOS transistor. Because the CMOS image sensor consistent with an embodiment of the present invention is provided with the direct connection between the gate terminal of an adjacent MOS transistor and the photodiode without additional connection metal, the potential variation of the photodiode may be transferred to the gate terminal of the adjacent MOS transistor without loss.

The CMOS image sensor consistent with a first embodiment of the present invention will be described hereinafter with reference to FIG. 1 and FIG. 2 in more detail.

Figure 2:
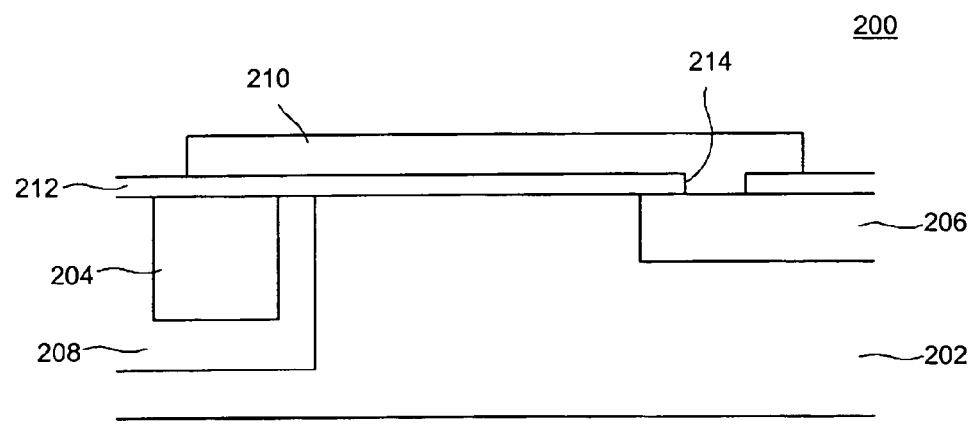
FIG. 2 is a cross-sectional view of the CMOS image sensor taken along line II-II' of FIG. 1.

FIG. 1 is a plan view a CMOS image sensor 200 consistent with the first embodiment of the present invention, and FIG. 2 is a cross-sectional view of CMOS image sensor 200 taken along line II-II' of FIG. 1.

As shown in FIG. 1 and FIG. 2, CMOS image sensor 200 is formed on a semiconductor substrate 202. A plurality of device isolation regions 204 are formed in semiconductor substrate 202 to define a plurality of active regions. Device isolation regions 204 (only one of which is shown in FIG. 2) may comprise shallow trench isolations (STI) including field oxide. A photo-sensing region (not numbered) is also defined in semiconductor substrate 200, wherein a photodiode 206 is formed in the photo-sensing region. CMOS image sensor 200 further includes an active device 208 formed over semiconductor substrate 200. Active device 208 may comprise a transistor and may include a gate terminal 210 over semiconductor substrate 200.

Over photodiode 206, an insulating layer 212 having a contact hole 214 is formed. The insulating layer 212 may comprise at least one layer and is formed of any of silicon oxide, silicon nitride, silicon oxide nitride, and transition metal oxide.

Consistent with the first embodiment of the present invention, gate terminal 210 is formed over insulating layer 212 and is connected to photodiode 206 through contact hole 214.

Because photodiode 206 and gate terminal 210 are directly connected to each other without a connection member, a potential variation of photodiode 206 may be efficiently transferred to gate terminal 210 without blockage.

A method for manufacturing CMOS image sensor 200 consistent with an embodiment of the present invention will be described hereinafter with reference to FIGS. 2 to 6 in detail.

FIGS. 3 to 6 are cross-sectional views illustrating manufacturing steps of CMOS image sensor 200 along line II-II' of FIG. 1 consistent with an embodiment of the present invention.

Figure 3:
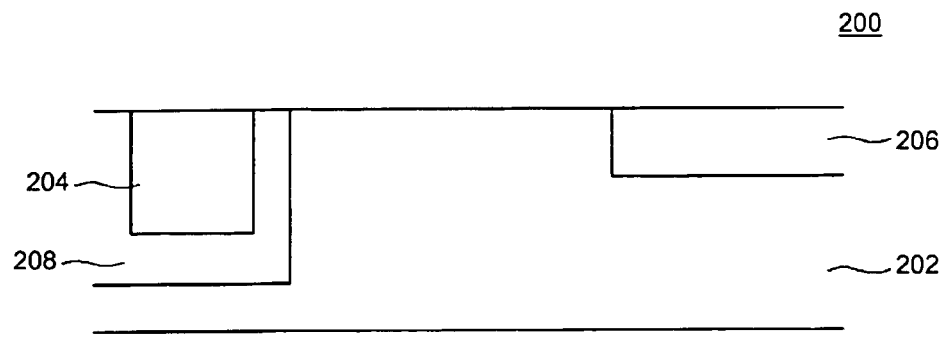
FIGS. 3 to 6 are cross-sectional views taken along line II-II' of FIG. 1 illustrating manufacturing steps of the CMOS image sensor consistent with the first embodiment of the present invention.

Referring to FIG. 3, a plurality of device isolation regions 204 (only one of which is shown in FIG. 3) are formed on semiconductor substrate 202 for defining active regions and electrically isolating active devices from one another. A photo-sensing region in which photodiode 206 is formed and active device 208 are formed in semiconductor substrate 200 through an impurity ion implantation process.

Figure 4:
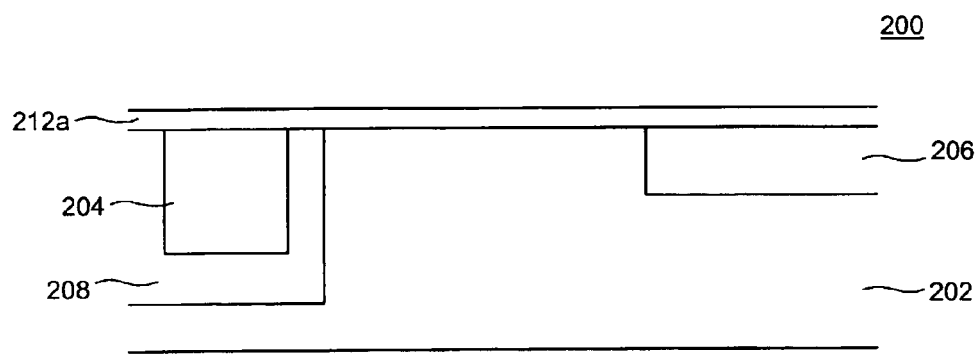

Next, as shown in FIG. 4, an insulating layer 212a is formed over substrate 200 at a predetermined thickness. Insulating layer 212a may be formed as a single layer or multiple layers of any of silicon oxide, silicon nitride, silicon oxide nitride, and transition metal oxide.

Figure 5:
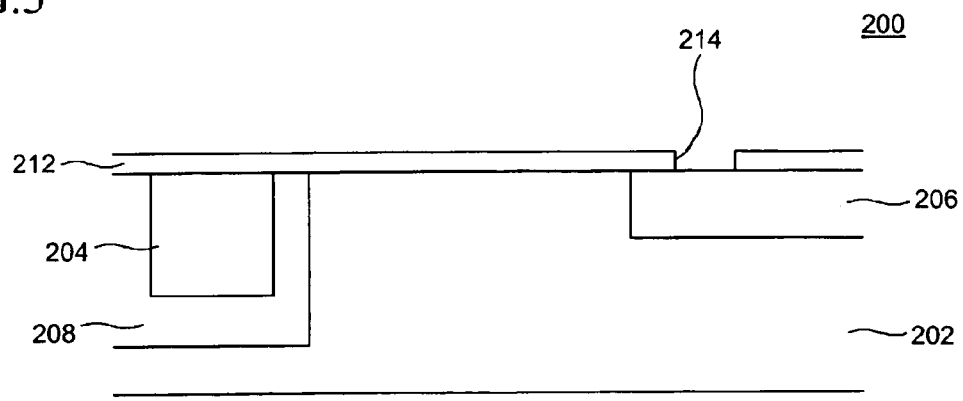

Next, as shown in FIG. 5, insulating layer 212a is patterned to form a contact hole 214 therein over photodiode 206, resulting in an insulating layer 212. Contact hole 214 may be formed by first providing a film of photoresist over insulating layer 212a and then exposing and developing the photoresist to form a contact hole pattern. Then, contact hole 214 is formed by etching (wet-etching) insulating layer 212a using the contact hole pattern as an etching mask. The photoresist is then removed. Insulating layer 212 is cleaned so as to complete the formation of contact hole 214.

Figure 6:
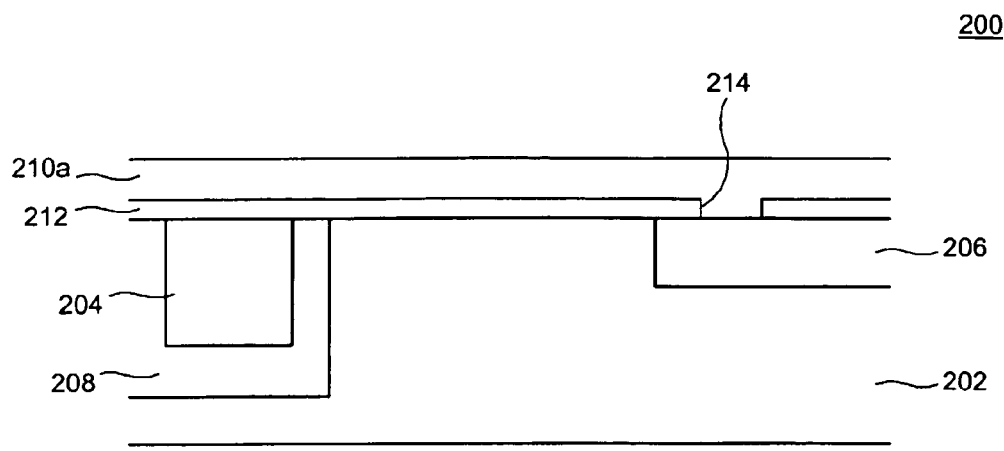
Figure 7:
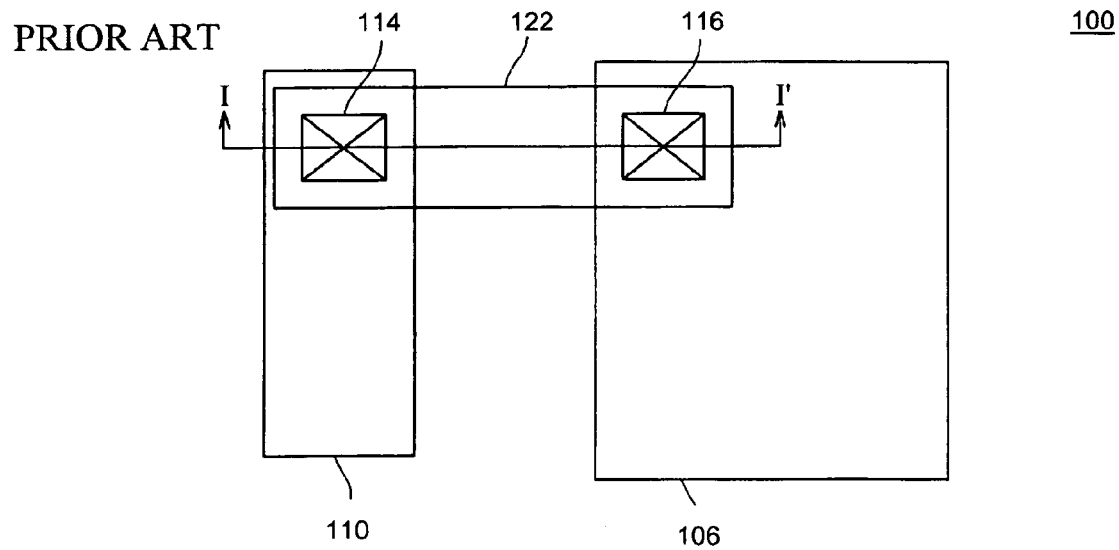
FIG. 7 is a plan view of a conventional CMOS image sensor.
Figure 8:
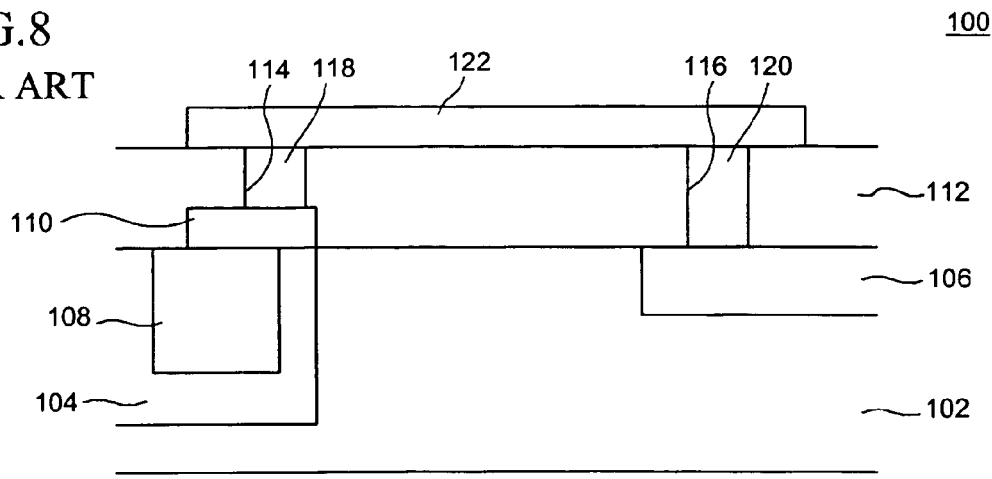
FIG. 8 is a cross-sectional view of the conventional CMOS image sensor taken along line I-I' of FIG. 7.

Next, as shown in FIG. 6, a gate polysilicon layer 210a is formed over insulating layer 212 having contact hole 214. Then, as shown in FIG. 2, gate polysilicon layer 210a is patterned to form gate terminal 210. Thus, gate terminal 210 and photodiode 206 are directly connected to each other through contact hole 214.

As described above, consistent with the first embodiment of the present invention, photodiode 206 and gate terminal 210 are directly connected to each other without additional connection member. Therefore, it is possible to efficiently transfer a potential variation of photodiode 206 to gate terminal 210 without blockage.

Also, because photodiode 206 and gate terminal 210 are directly connected to each other in CMOS image sensor 200 consistent with the present invention, it is possible to avoid damages caused by the dry etching used for forming contact hole 214 in conventional methods.

It will be apparent to those skilled in the art that various modifications and variations can be made in the disclosed process without departing from the scope or spirit of the invention. Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A method for manufacturing a CMOS image sensor, comprising:
   forming a photodiode on a substrate;
   forming an insulating layer over the substrate;
   forming a contact hole in the insulating layer over the photodiode; and
   forming a gate terminal over the insulating layer having the contact hole,
   wherein the gate terminal is directly connected to the photodiode through the contact hole which is filled with a gate polysilicon layer.

2. The method of claim 1, wherein the insulating layer is formed as at least one layer and is formed of any of silicon nitride, silicon oxide nitride, and transition metal oxide.

3. The method of claim 1, wherein the step of forming the gate terminal further includes:
   forming the gate polysilicon layer on the insulating layer having the contact hole; and
   patterning the gate polysilicon layer so as to form the gate terminal.

4. A method for manufacturing a CMOS image sensor, comprising:
   forming a photodiode on a substrate;
   forming a device isolation region and an active device in the substrate;
   forming an insulating layer over the substrate;
   forming a contact hole in the insulating layer over the photodiode; and
   forming a gate terminal over the insulating layer coupling the photodiode and the active device; and
   wherein the gate terminal is directly connected to the photodiode through the contact hole without a connecting member.

* * * * *